United States Patent

Minoru

Patent Number: 5,309,326
Date of Patent: May 3, 1994

[54] CIRCUIT MODULE HAVING STACKED CIRCUIT BOARDS

[75] Inventor: Hirai Minoru, Kyoto, Japan

[73] Assignee: Rohm Co., Ltd., Kyoto, Japan

[21] Appl. No.: 983,895

[22] Filed: Dec. 1, 1992

[30] Foreign Application Priority Data

Dec. 6, 1991 [JP] Japan ................... 3-349529

[51] Int. Cl.⁵ ............................................. H01R 23/68
[52] U.S. Cl. ................................. 361/790; 361/748; 361/760; 361/767; 361/813; 174/52.1; 174/52.2; 174/257; 257/686; 257/700
[58] Field of Search ............... 361/395, 396, 397, 398, 361/400, 401, 402, 403, 412, 414, 418, 417, 420, 421, 729, 735, 736, 744, 760, 761, 748, 767, 784, 792, 790, 808, 813; 174/52.1, 52.2, 52.3, 52.4, 255, 257, 259, 260; 257/686, 700, 692, 690, 779, 784, 787, 786

[56] References Cited

FOREIGN PATENT DOCUMENTS

57-69766  4/1982  Japan .
3-214691  9/1991  Japan ............................ 174/35 R

OTHER PUBLICATIONS

IBM Technical Disclosure Bulletin, Wadhwa, Low-cost circuit packaging, Jul. 1979, vol. 22, No. 2, p. 522.

*Primary Examiner*—Leo P. Picard
*Assistant Examiner*—Young Whang
*Attorney, Agent, or Firm*—Brumbaugh, Graves, Donohue & Raymond

[57] ABSTRACT

A circuit module has a first circuit board, an IC chip mounted on the first circuit board, an electrode of the IC chip being connected to a wiring pattern of the first circuit board by a metal wire and the IC chip and the metal wire being coated with resin, and a second circuit board on which at least one unit of the first circuit board and the IC chip is mounted. The first circuit board is a double-side wired circuit board and the second circuit board is a single-side wired circuit board.

2 Claims, 2 Drawing Sheets

CIRCUIT MODULE HAVING STACKED CIRCUIT BOARDS

BACKGROUND OF THE INVENTION

This invention relates to a circuit module making up a drive circuit of a liquid crystal display device, etc.

For example, assuming that a 5×7-dot font is counted as one character in a liquid crystal display device, one semiconductor for driving the liquid crystal (hereinafter referred to as IC) having about 80 pins is required to display 16 characters×one line or eight characters×two lines. The drive circuit is made up of a circuit board on which ICs are connected, and is referred to as a circuit module.

FIG. 4 shows a conventional circuit module which consists of a plastic-molded IC 10 connected to a circuit board 11 whose double sides (face and reverse) are wired with wiring patterns. The reason why double sides of the circuit board 11 must be wired is that it enables an efficient wiring change and drawing for changing the pin order for smooth connection to a liquid crystal display element with respect to the pin assignments of the IC 10 and the actual electrode arrangement of the liquid crystal display element.

However, the circuit board 11 with double sides wired is high in production cost as compared with a circuit board with a single side wired, and results in increasing the cost of a circuit module. The cost of production of the circuit board 11 with double sides wired increases in proportion to its area.

SUMMARY OF THE INVENTION

Accordingly, it is an object of the invention to provide a low cost circuit module.

To achieve the object, according to the invention, there is provided a circuit module comprising a semiconductor device in which a semiconductor element is mounted on a first circuit board, an electrode of the semiconductor element is connected to a wiring pattern of the first circuit board by a metal wire, and the semiconductor element and the metal wire are coated with resin; and a second circuit board on which at least one semiconductor device described above is mounted, wherein the first circuit board is a double-side wired circuit board and the second circuit board is a single-side wired circuit board.

According to the invention, the semiconductor element which is not plastic-molded is mounted on the first circuit board, thus the first circuit board can be made small. Further, if the double sides of the first circuit board are wired so as to enable the second circuit board to be made a single-side wired circuit board, the second circuit board having a large area becomes a board wired on its single side, which can be made in a low cost. Thus, even if the first circuit board is a double-side wired circuit board, the sum of the production costs of both the circuit boards can be reduced as compared with the conventional circuit board production costs.

DETAILED DESCRIPTION OF THE INVENTION

Referring now to the accompanying drawings, preferred embodiments of the invention will be described.

Figure 1:
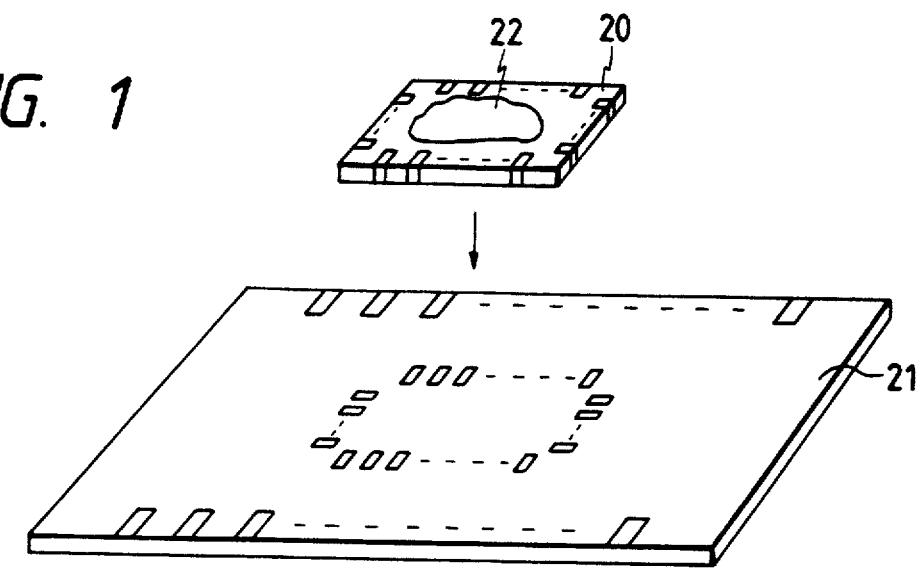
FIG. 1 is a perspective view of a circuit module embodying the invention.

FIG. 1 shows a perspective view of a circuit module embodying the invention, wherein a circuit board 20 is a double-side wired circuit board and a circuit board 21 is a single-side wired circuit board. Resin 22 in which an IC chip (not shown) is sealed is mounted on the circuit board 20. The circuit board 20 is connected to the predetermined area of the circuit board 21, making up a circuit module.

Figure 2A:
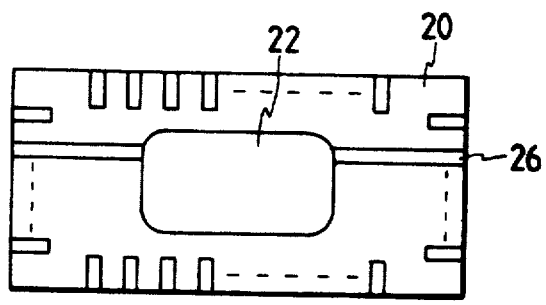
FIGS. 2(a) and 2(b) are a plan view and a section view, respectively, of a first circuit board on which a semiconductor element is mounted.
Figure 2B:
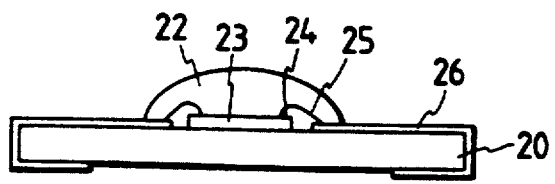

FIGS. 2 (a) and 2(b) are a plan view and a sectional view, respectively, of a circuit board 20 on which an IC chip is mounted.

Figure 3:
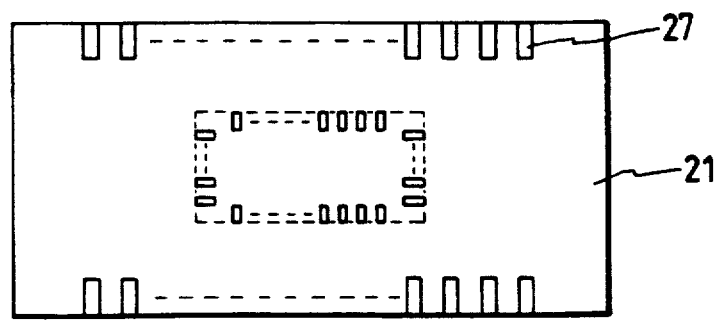
FIG. 3 is a plan view of a second circuit board.

An IC (integrated circuit) chip 23 is mounted on the circuit board 20. An electrode 24 of the IC chip 23 is connected to a wiring pattern 26 provided on the circuit board 20 by a metal wire 25. After all electrodes of the IC chip 23 are wired, the IC chip 23 and the metal wire 25 are sealed by resin 22. As described above, the circuit board 20 is a double-side wired circuit board, and wiring changes and drawing are made on the circuit board 20 so as to enable the circuit board 21 (shown in FIG. 1) on which the circuit board 20 is mounted, to be made a simple single-side wired circuit board. A circuit board 21 shown in FIG. 3 is a single-side wired board provided with a center area to mount the circuit board 20, around which a necessary wiring pattern 27 is formed.

How much the cost can be reduced by the invention will be described specifically.

Figure 4:
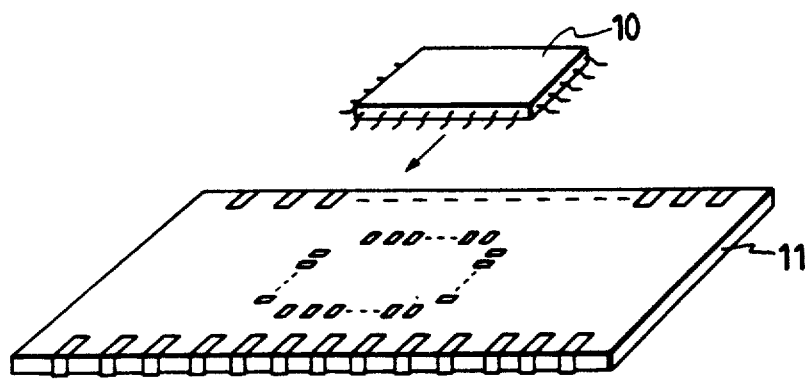
FIG. 4 is a perspective view of a conventional circuit module.

It is assumed that the size and cost of the conventional double-side wired circuit board 11 shown in FIG. 4 are 80 mm×40 mm and 1, respectively. Likewise, it is assumed that the size of the circuit board 21 shown in FIG. 3 is also 80 mm×40 mm and that the size of the circuit board 20 shown in FIG. 2 is 30 mm×15 mm.

The cost of a double-side wired circuit board is 1.5 times that of a single-side wired circuit board if they are of the same area. Therefore, from the ratio of the double-side wired board to the single-side wired board, the cost of the circuit board 21 is circuit board 21: $1 \times 1/1.5 = 0.67$ and from the area ratio, the cost of the circuit board 20 is circuit board 20: $1 \times (30 \times 15)/(80 \times 40) = 0.14$ The sum of these values is 0.81, thus the cost of the circuit boards of the circuit module configured as shown in FIG. 1 can be reduced about 20% as compared with the conventional circuit board cost.

As described above, according to the invention, only a first circuit board, the area of which can be made small since a semiconductor element is mounted in a chip form, is double-side wired and a second circuit board on which the first circuit board is mounted can be single-side wired, thus the production cost of the circuit boards as a whole can be reduced and a circuit module made up by the circuit boards can also be produced at low cost.

What is claimed is:

1. A circuit module comprising:
    a first circuit board, a semiconductor element mounted on the first circuit board, an electrode of said semiconductor element being connected to a wiring pattern of said first circuit board by a metal wire, and a resin coating on said semiconductor element and said metal wire; and a second circuit board having a larger area than the first circuit board, on which the first circuit board is mounted in stacked relation, wherein said first circuit board is a double-side wired circuit board and said second circuit board is a single-side wired circuit board.

2. The circuit module as claimed in claim 1, wherein said semiconductor element is an integrated circuit chip.

* * * * *

UNITED STATES PATENT AND TRADEMARK OFFICE
CERTIFICATE OF CORRECTION

PATENT NO. : 5,309,326

DATED : May 3, 1994

INVENTOR(S) : Minoru Hirai

It is certified that error appears in the above-indentified patent and that said Letters Patent is hereby corrected as shown below:

Cover Page:

Item [75], the inventor's name should read --MINORU HIRAI--;

Column 1, line 13, Delete "-" after the second X at the end of the line;

Column 1, line 66, "section" should read --sectional--.

Signed and Sealed this

Twentieth Day of September, 1994

Attest:

BRUCE LEHMAN

Attesting Officer	Commissioner of Patents and Trademarks